(12) United States Patent
Breese et al.

(10) Patent No.: US 7,564,248 B2
(45) Date of Patent: Jul. 21, 2009

(54) METHOD AND APPARATUS FOR MONITORING FUEL CELLS

(75) Inventors: Richard M. Breese, Los Angeles, CA (US); Thomas P. O'Meara, Venice, CA (US); Stanley K. Fujii, Torrance, CA (US); Bernd Peter Elgas, Hilbersheim (DE); Stephen Raiser, Wiesbaden (DE)

(73) Assignee: GM Global Technology Operations, Inc., Detroit, MI (US)

( * ) Notice: Subject to any disclaimer, the term of this patent is extended or adjusted under 35 U.S.C. 154(b) by 200 days.

(21) Appl. No.: 11/684,967

(22) Filed: Mar. 12, 2007

(65) Prior Publication Data

US 2008/0224687 A1  Sep. 18, 2008

(51) Int. Cl.
*G01R 27/08* (2006.01)
*H01M 8/00* (2006.01)

(52) U.S. Cl. .......................... 324/691; 324/713; 429/12

(58) Field of Classification Search .................. 324/691
See application file for complete search history.

(56) References Cited

U.S. PATENT DOCUMENTS

| | | | | |
|---|---|---|---|---|
| 6,952,103 | B2 * | 10/2005 | Herb et al. | 324/500 |
| 7,057,306 | B2 * | 6/2006 | Belschner et al. | 307/9.1 |
| 2006/0003198 | A1 * | 1/2006 | Leitz | 429/13 |
| 2007/0013382 | A1 * | 1/2007 | Hinz et al. | 324/500 |

\* cited by examiner

*Primary Examiner*—Diego Gutierrez
*Assistant Examiner*—Jeff Natalini

(57) ABSTRACT

Methods and apparatus are provided for monitoring a coolant conductivity of a fuel cell supplying power via positive and negative buses. The method includes measuring a first voltage of the positive bus, measuring a second voltage of the negative bus, applying a resistance between the positive bus and a reference potential, measuring a third voltage of the positive bus after a period of applying the resistance, and determining an isolation resistance based on the measured voltages. The isolation resistance is a function of the coolant conductivity.

20 Claims, 3 Drawing Sheets

_US 7,564,248 B2_

METHOD AND APPARATUS FOR MONITORING FUEL CELLS

TECHNICAL FIELD

The present invention generally relates to monitoring high voltage (HV) systems, and more particularly relates to methods and apparatus for monitoring fuel cell power systems.

BACKGROUND OF THE INVENTION

In a vehicle powered by a fuel cell power system, a fuel cell generates energy that may be supplied to various devices (e.g., power inverters, electric fans, etc.) via an HV bus. A fuel cell refers to one or more cells (e.g., a stack) that are commonly arranged in electrical series and typically include conductive elements (e.g., plates) having channels or openings formed therein for distributing an appropriate coolant throughout the fuel cell. The coolant is in electrical contact with an anode of the fuel cell. The conductivity of the coolant typically degrades due to factors such as ionization effects and material contamination. It is desirable to prevent the coolant from undesirably conducting electricity and thereby providing an electrical path to a ground (e.g., a vehicle chassis).

Accordingly, it is desirable to provide methods and apparatus for monitoring the coolant conductivity of a fuel cell. Additionally, it is desirable to provide low cost and relatively non-intrusive methods and apparatus for continuously measuring the coolant conductivity of a fuel cell. Furthermore, other desirable features and characteristics of the present invention will become apparent from the subsequent detailed description and the appended claims, taken in conjunction with the accompanying drawings and the foregoing technical field and background.

SUMMARY OF THE INVENTION

Methods and system are provided for monitoring a coolant conductivity of a fuel cell power module. In one embodiment, a method is provided for measuring the coolant conductivity of a fuel cell supplying power via a positive bus and a negative bus. The method comprises the steps of measuring a first voltage from the positive bus to a reference potential, measuring a second voltage from the negative bus to the reference potential, applying a pre-determined resistance between the positive bus and the reference potential, measuring a third voltage from the positive bus to the reference potential after a first pre-determined time period of applying the pre-determined resistance across the positive bus and the reference potential, and determining an isolation resistance based on the first, second, and third voltages. The isolation resistance is a function of the coolant conductivity.

In another embodiment, an apparatus is provided for measuring an isolation resistance in a fuel cell system. The apparatus comprises a first bus configured to couple with a fuel cell anode, a second bus configured to couple with a fuel cell cathode, a resistor having a first terminal coupled to the first bus and having a second terminal, a switch coupled to the second terminal of the resistor, and a controller having a first input coupled to the switch and having a second input coupled to the first and second buses. The switch is configured to selectively couple the second terminal of the resistor to a reference potential. The controller is configured to direct the switch to close, measure a voltage across the resistor after the switch is closed for a first pre-determined time period, and determine the isolation resistance based on the voltage.

In another embodiment, a method is provided for monitoring an isolation resistance of a high voltage (HV) bus powered by a fuel cell. The HV bus has positive and negative nodes. The method comprises the steps of measuring a first voltage from the positive node of the HV bus to a reference potential, measuring a second voltage from the negative node of the HV bus to the reference potential, coupling a pre-determined resistance across the positive node of the HV bus and the reference potential, measuring a third voltage between the positive node of the HV bus and the reference potential after a first predetermined time period from coupling the pre-determined resistance across the positive node of the HV bus and the reference potential, determining an isolation resistance based on the first, second, and third voltages, and transmitting a signal if the isolation resistance if less than a predetermined percentage of a minimum resistance. The signal indicates a low isolation resistance of the HV bus.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely illustrative in nature and is not intended to limit the exemplary embodiments of the invention or the application and uses of the exemplary embodiments of the invention. Furthermore, there is no intention to be bound by any expressed or implied theory presented in the preceding technical field, background, brief summary or the following detailed description.

Methods and apparatus are provided for monitoring a fuel cell power system. In general, the fuel cell supplies energy to a variety of devices via a high voltage (HV) bus, which collectively includes as a positive bus and a negative bus. For example, the fuel cell has a cathode coupled to the positive bus and an anode coupled to the negative bus, and the devices may be coupled to the HV bus by being coupled to one or both of the buses. A variety of devices may be coupled to the HV bus (e.g., to draw power therefrom). The HV bus has an isolation resistance that may result from a variety of combined (e.g., parallel or serial) effects of substantially non-varying isolation resistances (e.g., power electronic devices and fuel cell geometry) and a varying isolation resistance attributed to the fuel cell coolant. When the fuel cell coolant is relatively "new" (e.g., a new fuel cell power system or the fuel cell coolant has been recently replaced), the isolation resistance measured from the HV bus is substantially dominated by the substantially non-varying isolation resistances. As the fuel cell coolant degrades over time (e.g., months), the isolation resistance measured from the HV bus is dominated by the varying isolation resistance attributed to the fuel cell coolant, and this measured isolation resistance is inversely proportional to the conductivity of the fuel cell coolant. Thus, monitoring the isolation resistance of the HV bus provides an indication of the conductivity of the fuel cell coolant.

Figure 1:
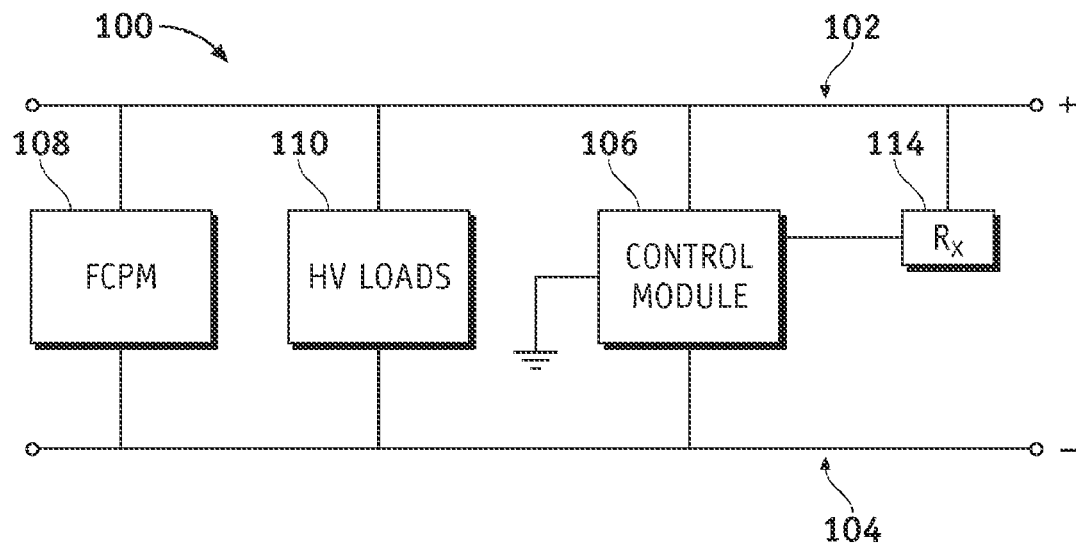
FIG. 1 is a schematic diagram of a fuel cell control circuit in accordance with an exemplary embodiment of the present invention.

Referring to FIG. 1, a fuel cell control circuit 100 is shown in accordance with an exemplary embodiment of the present invention. The fuel cell control circuit 100 comprises positive and negative HV buses 102, 104, respectively, a fuel cell power module (FCPM) 108 coupled between the HV buses 102 and 104 (e.g., an anode of the FCPM 108 coupled to the positive bus 102 and a cathode of the FCPM 108 coupled to the negative bus 104), one or more HV loads 110 coupled to at least one of the HV buses 102, 104, a control module 106 coupled between the HV buses 102 and 104, and a resistor 114 having a pre-determined resistance and having a first terminal coupled to the positive bus 102 and a second terminal coupled to the control module 106. In this configuration, the HV buses 102, 104 are referred to as "isolated" such that the HV buses 102, 104 are not directly coupled to a ground or a chassis (e.g., a vehicle chassis which is typically grounded).

The HV load 110 may include one or more devices that are supplied energy by the FCPM 108. In a vehicle application, the HV load 110 includes, but is not necessarily limited to, electric fans, power inverters, or the like. Additional devices (e.g., a power electronics package, a power management distribution (PMD), or the like) may be coupled to the HV buses 102 and 104. The FCPM 108 supplies power via the HV buses 102, 104 and comprises one or more fuel cells (e.g., a single fuel cell or a fuel cell stack) having a coolant that is in contact with at least one of the anode and cathode of the FCPM 108. The FCPM 108 may further comprise one or more auxiliary power sources (e.g., an HV battery supply) electrically coupled with the fuel cell(s).

The control module 106 determines an overall isolation resistance associated with the HV buses 102 and 104, which is inversely proportional to the conductivity of the HV buses 102 and 104. While the fuel cell coolant is not substantially degraded, the overall isolation resistance measured from the HV buses 102 and 104 is dominated by isolation resistances attributed to the HV load 110, the fuel cell geometry, and the like, which are substantially non-varying. As the fuel cell coolant degrades over time, the overall isolation resistance measured from the HV buses 102 and 104 is dominated by the varying isolation resistance attributed to the fuel cell coolant. Monitoring the overall isolation resistance from the HV buses 102 and 104 thus provides an indication of the conductivity of the fuel cell coolant.

To monitor the overall isolation resistance, the control module 106 measures an isolation voltage (e.g., from the HV buses 102 and 104 to a reference potential such as a ground) and induces a shift in isolation voltage. In one embodiment, a test resistance is coupled in parallel with the isolation resistance associated with the positive HV bus 102 (e.g., from the positive HV bus 102 to ground) to cause an isolation voltage shift. In this embodiment, the control module 106 selectively couples the resistor 114 to a reference potential (e.g., to ground) and measures a positive isolation voltage from the positive HV bus 102 to ground. This measurement is compared with the previously measured isolation voltage (e.g., the isolation voltage from the positive HV bus 102 to ground prior to coupling the test resistance in parallel with the isolation resistance associated with the positive HV bus 102). The resulting change in the isolation voltage (e.g., the change in the positive isolation voltage from the positive HV bus 102 to ground) is used by the control module 106 to determine the overall isolation resistance.

Figure 2:
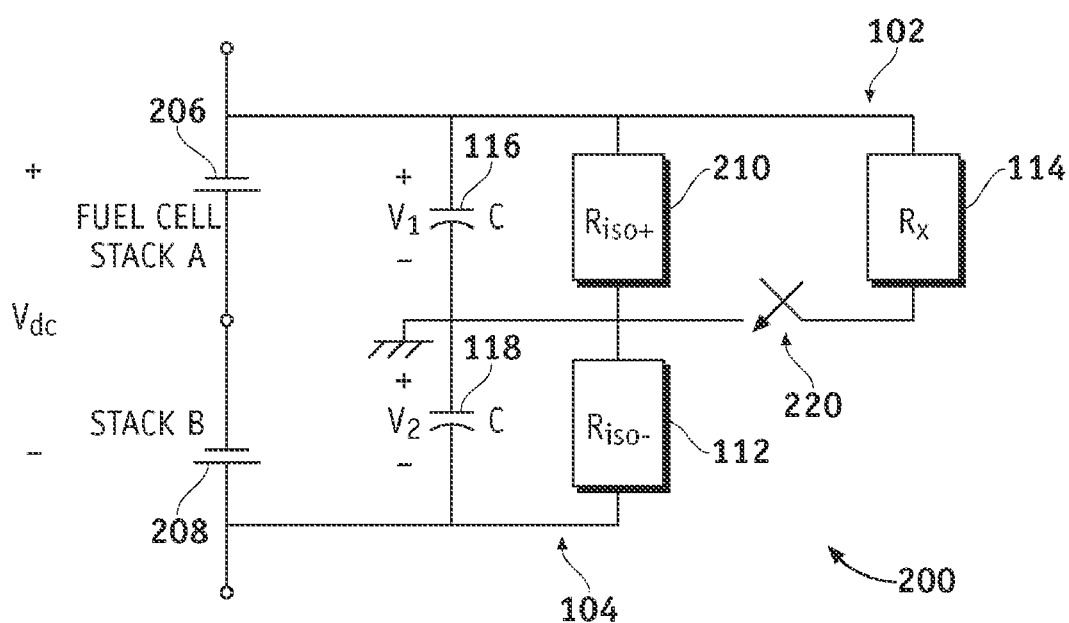
FIG. 2 is a schematic diagram of an isolation resistance measurement circuit in accordance with an exemplary embodiment.

FIG. 2 is a schematic diagram of an isolation resistance measurement circuit 200 in accordance with one embodiment of the present invention. Referring to FIGS. 1 and 2, the circuit 200 may be implemented using the control module 106 and is configured to couple to one or more fuel cells (e.g., a Fuel Cell Stack A 206 and Fuel Cell Stack B 208), such as in the FCPM 108. In this embodiment, the circuit 200 comprises the resistor 114 having a first terminal coupled to the positive bus 102, and a test switch 220 coupled to a second terminal of the resistor 114. The test switch 220 may be a transistor-based device (e.g., a metal oxide semiconductor field effect transistor (MOSFET) device, a bipolar transistor device, an insulated gate bipolar transistor (IGBT) device, or the like) to simplify circuitry and intrusiveness, although other switching devices and circuits may be used.

Isolation voltages are measured (e.g., by the control module 106) for the HV buses 102 and 104. For example, a positive isolation voltage ($V_1$) is measured from the positive HV bus 102 to ground, and a negative isolation voltage ($V_2$) is measured from the negative HV bus 104 to ground. Additionally, a positive isolation resistance ($R_{iso+}$) may be measured from the positive HV bus 102 to ground, and a negative isolation resistance ($R_{iso-}$) may be measure from the negative HV bus 104 to ground. Additionally, a capacitance (C) may be measured from each of the HV buses 102 and 104 with respect to ground. The capacitance (C) is pre-determined based on the HV buses 102, 104 and the various devices (e.g., the HV load 110) coupled thereto (e.g., a Y-capacitance). The capacitance (C) may also assist in reducing switching noise.

In operation, the control module 106 measures the positive isolation voltage ($V_1$) and the negative isolation voltage ($V_2$), and an isolation ratio (k) is determined from a ratio of the negative isolation voltage ($V_2$) to the positive isolation voltage ($V_1$). In a fuel cell powered vehicle application, the positive and negative isolation voltage measurements may be periodically performed during the course of performing one or more other routines (e.g., fuel cell power level monitoring). In this vehicle application, the positive and negative isolation resistance measurements may be performed by another control module, such as a PMD coupled to the fuel cells 206, 208. The PMD may be embodied in software or firmware, hardware, such as an application specific integrated circuit (ASIC), an electronic circuit, a processor (shared, dedicated, or group), a combinational logic circuit, and memory that execute one or more software or firmware programs, and/or other suitable components or combinations thereof. Among various functions, the PMD may be operated to manage the HV power from the fuel cells 206, 208, distribute the HV power to various devices, perform power conversion, measure isolation resistance of the HV buses 102, 104, determine the isolation ratio (k), control the test switch 220, maintain HV safety associated with the fuel cells 206, 208, and the like. The PMD may also operate one or more programs to perform these functions.

For each of the periodic measurements of the isolation voltages ($V_1$ and $V_2$), the control module 106 causes an isolation voltage shift. The isolation resistance determination may be periodically or intermittently performed. To cause an isolation voltage shift, the control module 106 transmits a signal to the test switch 220 to close the test switch 220 and thereby couple the second terminal of the resistor 114 to ground. The test switch 220 is closed for a pre-determined amount of time (t), and the value of the resistor 114, $R_x$, may be selected based on convenience (e.g., having a manageable voltage value for measuring).

Based on the time (t) after closing the test switch 220, the positive isolation voltage ($V_1$) is measured again and the following equation is solved for the positive isolation resistance ($R_{iso+}$):

$$V_1(t) = V_{dc}/(k^*R_{iso+}/R_x + k + 1) + [V_{dc}/(1+k) - V_{dc}/(k^*R_{iso-}/R_x + k + 1)]^* e^{-[(k^*R_{iso+}/R_x + k + 1)/2k^*R_{iso+}*C]^*t} \quad \text{(eq. 1)}$$

where $V_{dc}$ is the direct current (DC) voltage supplied by the fuel cells 206, 208. Various techniques may be used to solve this equation (eq. 1) including, but not necessarily limited to, successive approximation. The time (t) may be selected to sufficiently induce an isolation voltage shift without significantly reducing the isolation of the fuel cell control circuit 100 (e.g., about 0.6 seconds).

Although the positive isolation voltage ($V_1$) is measured, the negative isolation voltage ($V_2$) may be measured to determine the isolation resistance with a corresponding modification to the circuit 200 to enable switching a pre-determined resistance in parallel with the negative isolation resistance ($R_{iso-}$). Additionally, the negative isolation voltage ($V_2$) can be solved using a modified version of eq. 1. After measuring the positive isolation voltage ($V_1$), the control module 106 directs the test switch 220 to open and thereby switch-out the resistor 114. After a pre-determined time period (e.g., about ten (10) seconds), the isolation voltages ($V_1$ and $V_2$) may be measured again without the resistor 114 being coupled in parallel with the positive isolation resistance (e.g., from the positive HV bus 102 to ground). This time period may be selected based on a settling time for measuring the isolation voltages ($V_1$ and $V_2$) or other operating characteristics, such as the time for solving eq. 1. Thus, the overall isolation resistance ($R_{iso}$) may be periodically (e.g., every ten (10) seconds) determined.

The control module 106 determines an overall isolation resistance ($R_{iso}$) based on the positive isolation resistance ($R_{iso+}$) being in parallel with the negative isolation resistance ($R_{iso-}$) and determines whether the overall isolation resistance ($R_{iso}$) is within a predetermined minimum resistance. The overall isolation resistance is dominated by the varying isolation resistance attributed to the fuel cell coolant as the fuel cell coolant degrades over time. In one embodiment, the control module 106 reports the overall isolation resistance ($R_{iso}$) to another control module (e.g., to a fuel cell vehicle controller using a controller area network (CAN) serial data bus) that determines if the overall isolation resistance ($R_{iso}$) is within the pre-determined minimum resistance. The minimum resistance may be based on maintaining a relationship of the overall isolation resistance ($R_{iso}$) with respect to the fuel cell voltage output (e.g., about 100Ω to about 1V). If the isolation resistance is less than the minimum resistance, this can indicate a sufficient change in the coolant conductivity to warrant further action (e.g., transmitting a low isolation resistance warning and eventually replacing the coolant). For example, if the overall isolation resistance ($R_{iso}$) is less than about 120% of the minimum resistance, the low isolation resistance warning is transmitted (e.g., via CAN).

Figure 3:
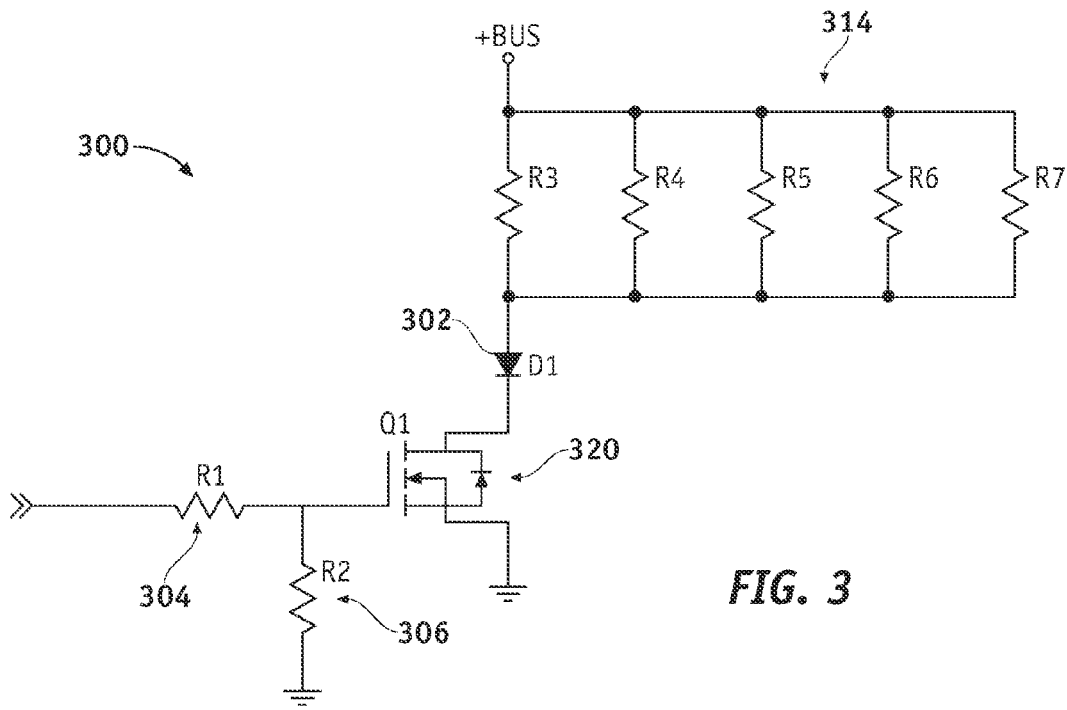
FIG. 3 is a circuit diagram of an isolation resistance measurement circuit in accordance with one embodiment.

FIG. 3 is a circuit diagram of an isolation resistance measurement circuit 300 in accordance with one embodiment. In this embodiment, the circuit 300 comprises a test resistance 314 having a first terminal for coupling to an HV bus, a diode 302 having an anode coupled to a second terminal of the test resistance 314, an IGBT switch 320 having a drain coupled to a cathode of the diode 302 and having a collector coupled to ground, a first resistor 306 having a first terminal coupled to a gate of the IGBT switch 320 and having a second terminal coupled to ground, and a second resistor 304 having a first terminal coupled to the gate of the IGBT switch 320 and having a second terminal configured to receive a signal that controls the IGBT switch 320 to open and close. The test resistance 314 may comprise one or more resistors (e.g., R3, R4, R5, R6, and R7).

Referring to FIGS. 2 and 3, the isolation resistance measurement circuit 300 may be inserted in place of the resistor 114 and the test switch 220 in the isolation resistance measurement circuit 200. For example, the first terminal of the test resistance 314 may be coupled to the positive HV bus 102. In this example, the second terminal of the second resistor 304 receives a signal from the control module 106 to open and close the IGBT switch 320.

Figure 4:
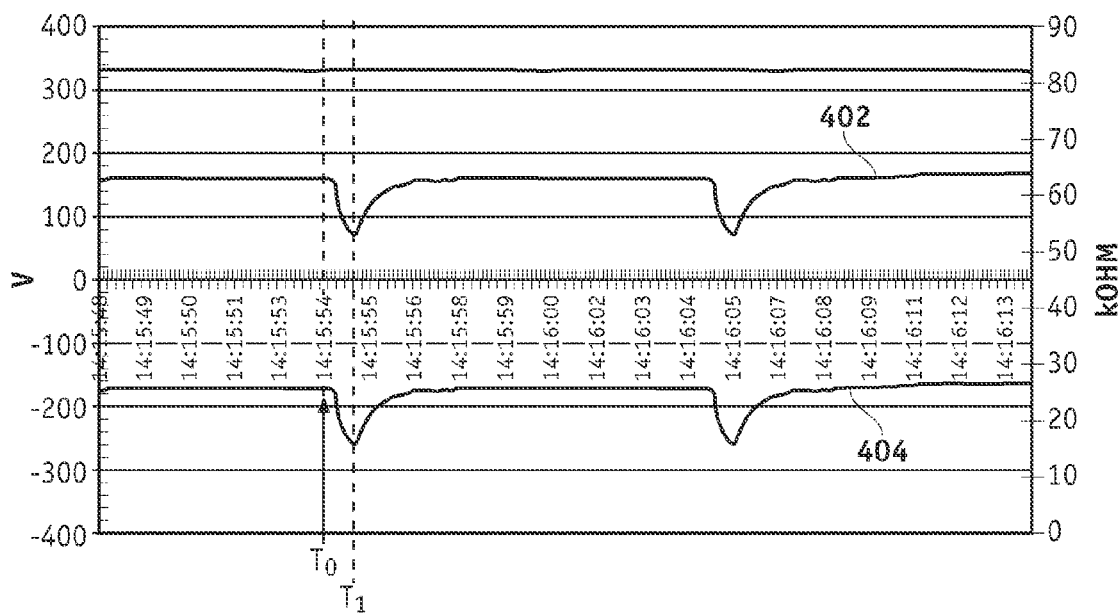
FIG. 4 is a plot of isolation voltages versus time for an isolation resistance measurement in accordance with an exemplary embodiment of the present invention.

FIG. 4 is a plot of isolation voltages 402, 404 versus time for an isolation resistance measurement in accordance with one embodiment. In this exemplary embodiment, a positive isolation voltage 402 and a negative isolation voltage 404 are measured and plotted over time using, for example, the isolation resistance measurement circuit 200 shown in FIG. 2. Referring to FIGS. 2 and 4, at a time $T_0$, the resistor 114 is switched-in by closing the test switch 220 to couple the resistor 114 to ground. Prior to time $T_0$, the isolation voltages 402, 404 may be sampled to determine the isolation ratio (k). The isolation voltages 402, 404 decrease in response to the resistor 114 being switched-in because the resistor 114 draws energy from the fuel cells 206, 208. At a time $T_1$ (e.g., about 0.6 seconds after time $T_0$), the isolation voltages 402, 404 may be sampled and used to determine the overall isolation resistance associated with the HV buses 102, 104 and indicative of the coolant conductivity of the fuel cells 206, 208. After time $T_1$, the test switch 220 is opened to switch-out the resistor 114, and the isolation voltages 402, 404 recover. The value ($R_x$) of resistor 114 may be selected to obtain a sufficiently measurable deflection of the isolation voltages 402, 404 after the resistor 114 is switched-in, while also maintaining isolation of the HV buses 102, 104.

Figure 5:
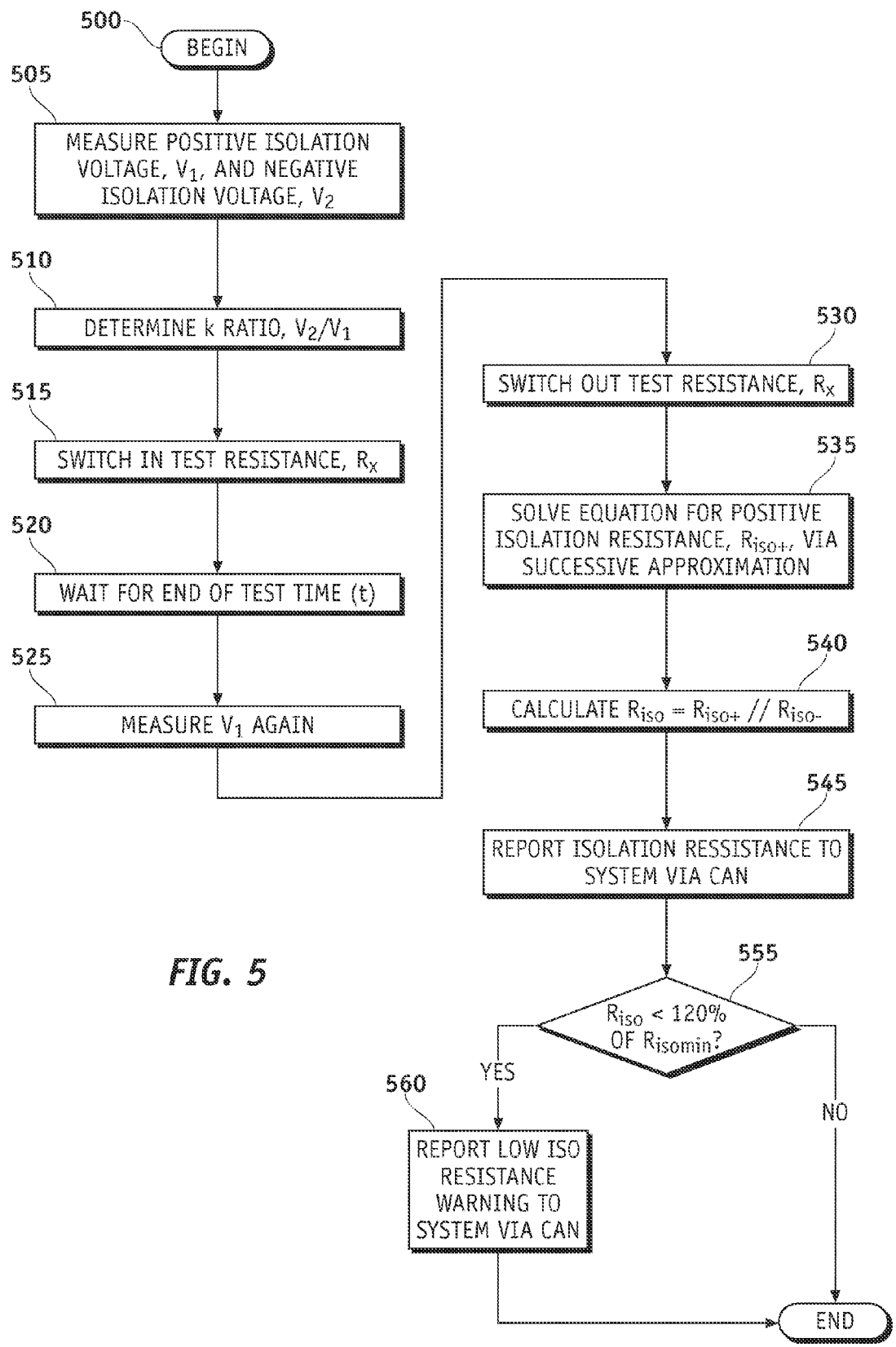
FIG. 5 is a flow diagram of a method for monitoring isolation resistance in a fuel cell power system in accordance with an exemplary embodiment of the present invention.

FIG. 5 is a flow diagram of a method 500 for monitoring isolation resistance in a fuel cell power system in accordance with an exemplary embodiment of the present invention. Referring to FIGS. 1, 2, and 5, positive and negative isolation voltages are measured (e.g., via the control module 106), as indicated at step 505. For example, a positive isolation voltage is measured from the positive HV bus 102 to ground, and a negative isolation voltage is measured from the negative HV bus 104 to ground. An isolation ratio (e.g., k) is determined from the positive and negative isolation voltages, as indicated at step 510.

A test resistance is switched-in, as indicated at step 515. For example, the resistor ($R_x$) 114 is coupled across the positive HV bus 102 to ground by closing the test switch 220. The isolation ratio is preferably determined using the sampled values of the isolation voltages prior to switching-in the test resistance. A pre-determined amount of time (e.g., about 0.6 seconds) is elapsed after switching-in the test resistance, as indicated at step 520. After the pre-determined amount of time, the positive isolation voltage is measured again, as indicated at step 525. The test resistance is switched-out, as indicated at step 530. For example, the resistor ($R_x$) 114 is de-coupled from ground by opening the test switch 220.

A positive isolation resistance ($R_{iso+}$) is determined, as indicated at step 535. The positive isolation resistance ($R_{iso+}$) is associated with the positive HV bus 102 with respect to ground. For example, the equation $$V_1(t)=V_{dc}/(k*R_{iso+}/R_x+k+1)+[V_{dc}/(1+k)-V_{dc}/(k*R_{iso-}/R_x+k+1)]* e^{-[(k*R_{iso+}/R_x+k+1)/2k*R_{iso+}*C]*t}$$

is solved for the positive isolation resistance ($R_{iso+}$) where $V_1(t)$ is the measured positive isolation voltage at the pre-determined mount of time (t), and $V_{dc}$ is the DC voltage supplied by the fuel cells 206, 208. This equation may be solved using successive approximation.

An overall isolation resistance (e.g., $R_{iso}$) is determined for the positive isolation resistance ($R_{iso+}$) being in parallel with a negative isolation resistance ($R_{iso-}$), as indicated at step 540. The negative isolation resistance ($R_{iso-}$) is associated with the negative HV bus 104 with respect to ground. The isolation resistance ($R_{iso}$) is reported via CAN, as indicated at step 545. For example, the control module 106 transmits a signal indicating the isolation resistance to a fuel cell vehicle controller via CAN. A determination is made as to if the isolation resistance is less than a pre-determined minimum resistance ($R_{isomin}$), as indicated at step 550. In one embodiment, a determination is made as to if the isolation resistance ($R_{iso}$) is less than about 120% of the minimum resistance ($R_{isomin}$). If the isolation resistance ($R_{iso}$) is less than about 120% of the minimum resistance ($R_{isomin}$), a low resistance warning is transmitted, as indicated at step 555. For example, the control module 106 transmits a signal, indicating a low isolation resistance, to the fuel cell vehicle controller (via the CAN) if $R_{iso}$<120% of $R_{isomin}$. After another pre-determined time period (e.g., about 10 seconds) from switching-out the test resistance, the method 500 may be repeated.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for monitoring a fuel cell having a coolant conductivity, the fuel cell supplying power via positive and negative buses, the method comprising the steps of:
    measuring a first voltage from the positive bus to a reference potential;
    measuring a second voltage from the negative bus to the reference potential;
    applying a pre-determined resistance between the positive bus and the reference potential;
    during a single voltage cycle, measuring a third voltage from the positive bus to the reference potential after a first pre-determined time period after said applying step; and
    determining an isolation resistance based on the first voltage, the second voltage, and the third voltage that was measured during the single voltage cycle, wherein the isolation resistance is a function of the coolant conductivity.

2. A method according to claim 1, further comprising transmitting a signal via a controller area network, the signal indicating the isolation resistance.

3. A method according to claim 1, further comprising, prior to said determining step, switching out the pre-determined resistance for a second pre-determined time period.

4. A method according to claim 1, wherein said step of measuring a third voltage comprises measuring the third voltage at about 0.6 seconds after said step of applying the pre-determined resistance.

5. A method according to claim 1, wherein said step of determining the isolation resistance comprises:
    determining a ratio of the second voltage to the first voltage;
    determining a positive isolation resistance based on the third voltage, the ratio of the second voltage to the first voltage, the pre-determined resistance, the first pre-determined time period, a direct current (DC) supply voltage based on the fuel cell, and a pre-determined capacitance from one of the positive bus and negative bus to the reference potential.

6. A method according to claim 5, wherein said step of determining a positive isolation resistance comprises solving $$V_1(t)=V_{dc}/(k*R_{iso+}/R_x+k+1)+[V_{dc}/(1+k)-V_{dc}/(k*R_{iso+}/R_x+k+1)]*e^{-[(k*R_{iso+}/R_x+k+1)/2k*R_{iso+}*C]*t},$$

where $V_1$ is the third voltage, t is the first pre-determined time period, $V_{dc}$ is the DC supply voltage, k is the ratio of the second voltage to the first voltage, $R_{iso+}$ is the positive isolation resistance, $R_x$ is the pre-determined resistance from the positive bus to the reference potential, and C is the pre-determined capacitance.

7. A method according to claim 6, wherein said step of determining a positive isolation resistance comprises solving $$V_1(t)=V_{dc}/(k*R_{iso+}/R_x+k+1)+[V_{dc}/(1+k)-V_{dc}/(k*R_{iso+}/R_x+k+1)]*e^{-[(k*R_{iso+}/R_x+k+1)/2k*R_{iso+}*C]*t},$$

using a successive approximation.

8. A method according to claim 1, wherein said step of determining an isolation resistance comprises determining the isolation resistance from a positive isolation resistance in parallel with a negative isolation resistance, the positive isolation resistance based on the positive bus to the reference potential, and the negative isolation resistance based on the negative bus to the reference potential.

9. An apparatus for measuring an isolation resistance in a fuel cell system, the apparatus comprising:
    a first bus configured to couple with a fuel cell anode;
    a second bus configured to couple with a fuel cell cathode;
    a resistor having a first terminal coupled to said first bus and having a second terminal;
    a switch coupled to said second terminal of said resistor, said switch configured to selectively couple said second terminal of said resistor to a reference potential; and
    a controller having a control output controlling said switch and having a first and a second input coupled to said first and second buses, said controller configured to:
        direct said switch to close;
        measure a voltage across said resistor after said switch is closed for a first pre-determined time period during a single voltage cycle; and
        determine the isolation resistance based on said voltage measured during said single voltage cycle.

10. An apparatus according to claim 9, wherein said controller is further configured to:
    measure a first isolation voltage from said positive bus to said reference potential;
    measure a second isolation voltage from said negative bus to said reference potential;
    determine a ratio of said second isolation voltage to said first isolation voltage;
    determine a positive isolation resistance from said positive bus to said reference potential; and determine the isolation resistance for said positive isolation resistance in parallel with a negative isolation resistance, said negative isolation resistance from said negative bus to said reference potential.

11. An apparatus according to claim 10, wherein said controller is further configured to transmit the isolation resistance.

12. An apparatus according to claim 10, wherein said controller is further configured to solve $$V_1(t)=V_{dc}/(k*R_{iso+}/R_x+k+1)+[V_{dc}/(1+k)-V_{dc}/(k*R_{iso+}/R_x+k+1)]*e^{-[(k*R_{iso+}/R_x+k+1)/2k*R_{iso+}*C]*t},$$

wherein $V_1$ is said voltage across said resistor after said switch is closed for said first pre-determined time period, t is said first pre-determined time period, $V_{dc}$ is a direct current (DC) voltage from said fuel cell anode to said fuel cell cathode, k is said ratio of said second isolation voltage to said first isolation voltage, $R_{iso+}$ is said positive isolation resistance, $R_x$ is a pre-determined resistance from said positive bus to said reference potential, and C is a pre-determined capacitance from one of said positive bus and said negative bus to said reference potential.

13. An apparatus according to claim 12, wherein said controller is further configured to solve $$V_1(t)=V_{dc}/(k*R_{iso+}/R_x+k+1)+[V_{dc}/(1+k)-V_{dc}/(k*R_{iso+}/R_x+k+1)]*e^{-[(k*R_{iso+}/R_x+k+1)/2k*R_{iso+}*C]*t},$$

using a successive approximation.

14. An apparatus according to claim 9, wherein said controller is further configured to direct said switch to open for a second pre-determined time period after measuring said voltage across said resistor after said switch is closed for said first pre-determined time period.

15. An apparatus according to claim 9, wherein said controller is further configured to transmit a signal if the isolation resistance is less than a pre-determined percentage, said signal indicating a low isolation resistance.

16. An apparatus according to claim 9, wherein said controller is further configured to:
transmit the isolation resistance; and
transmit a signal if the isolation resistance is less than about 120% of a minimum resistance, said signal indicating a low isolation resistance.

17. A method for monitoring an isolation resistance of a high voltage (HV) bus powered by a fuel cell, the HV bus having positive and negative nodes, the method comprising the steps of:
measuring a first voltage from the positive node of the HV bus to a reference potential;
measuring a second voltage from the negative node of the HV bus to the reference potential;
coupling a pre-determined resistance across the positive node of the HV bus and the reference potential;
measuring a third voltage between the positive node of the HV bus and the reference potential after a first predetermined time period during a single voltage cycle from said coupling step;
determining an isolation resistance based on the first voltage, the second voltage, and the third voltage measured during the single voltage cycle; and
transmitting a signal if the isolation resistance if less than a pre-determined percentage of a minimum resistance, the signal indicating a low isolation resistance of the HV bus.

18. A method according to claim 17, wherein said step of transmitting a signal comprises transmitting the signal if the isolation resistance is less than about 120% of the minimum resistance.

19. A method according to claim 17, further comprising, prior to said step of determining the isolation resistance, switching out the pre-determined resistance.

20. A method according to claim 17, wherein the fuel cell has a fuel cell voltage output; and wherein said step of transmitting a signal comprises transmitting the signal if the isolation resistance is less than a minimum resistance for maintaining a relationship of the isolation resistance with respect to the fuel cell voltage output of about 100Ω to about 1V.

* * * * *